United States Patent [19]

Miyazaki et al.

[11] Patent Number: 5,424,995
[45] Date of Patent: Jun. 13, 1995

[54] STATIC RANDOM ACCESS MEMORY ALLOWING READING ANGLE ROTATION

[75] Inventors: Yukio Miyazaki; Takenori Okitaka, both of Hyogo, Japan

[73] Assignee: Mitsubishi Denki Kabushiki Kaisha, Tokyo, Japan

[21] Appl. No.: 894,149

[22] Filed: Jun. 4, 1992

[30] Foreign Application Priority Data

Jun. 5, 1991 [JP] Japan .................................. 3-134098
May 20, 1992 [JP] Japan .................................. 4-127526

[51] Int. Cl.⁶ ................................................ G11C 8/00
[52] U.S. Cl. ................................ 365/230.05; 365/154; 365/156; 365/190
[58] Field of Search ................ 365/154, 190, 189.01, 365/230.05, 155, 156, 230.04

[56] References Cited

U.S. PATENT DOCUMENTS

| 4,536,859 | 8/1985 | Kamuro | 365/154 |
| 4,541,076 | 9/1985 | Bowers et al. | 365/156 |
| 4,571,703 | 2/1986 | Noda | 365/154 |
| 4,825,098 | 4/1989 | Aoyama | 365/154 |
| 5,289,432 | 2/1994 | Dhong et al. | 365/154 |

FOREIGN PATENT DOCUMENTS

| 0145497 | 6/1985 | European Pat. Off. | 365/154 |
| 0339219 | 11/1989 | European Pat. Off. | |
| 0434852 | 7/1991 | European Pat. Off. | 365/154 |
| 0142596 | 6/1986 | Japan | 365/154 |
| 0076092 | 4/1987 | Japan | 365/230.05 |
| 63-53783 | 3/1988 | Japan . | |

Primary Examiner—Joseph A. Popek
Assistant Examiner—Vu Le
Attorney, Agent, or Firm—Lowe, Price, LeBlanc & Becker

[57] ABSTRACT

A plurality of first word lines are connected to a first word selector, and a plurality of second word lines are connected to a second word selector. A plurality of first bit lines are connected to a first bit selector, and a plurality of second bit lines are connected to a second bit selector. Each memory cell includes two inverters and first and second access gates. Each memory cell is connected to the first word line, the second word line, the first bit line and the second bit line. In data writing, data is written to a node through the first access gate. In data reading, data at the node or node is read through either the first or the second access gate.

4 Claims, 14 Drawing Sheets

FIG. 4

| MC1 | MC2 |
|---|---|
| 1 / D1 | 2 / D2 |
| 3 / D3 | 4 / D4 |
| MC3 | MC4 |

(0° WRITING)
DATA WRITING SEQUENCE
D1→D2→D3→D4

| MC1 | MC2 |
|---|---|
| 1 / D1 | 2 / D2 |
| 3 / D3 | 4 / D4 |
| MC3 | MC4 |

(0° READING)
DATA READING SEQUENCE
D1→D2→D3→D4

| MC1 | MC2 |
|---|---|
| 3 / D1 | 1 / D2 |
| 4 / D3 | 2 / D4 |
| MC3 | MC4 |

(90° READING)
DATA READING SEQUENCE
D2→D4→D1→D3

| MC1 | MC2 |
|---|---|
| 4 / D1 | 3 / D2 |
| 2 / D3 | 1 / D4 |
| MC3 | MC4 |

(180° READING)
DATA READING SEQUENCE
D2→D1→D4→D3

| MC1 | MC2 |
|---|---|
| 2 / D1 | 4 / D2 |
| 1 / D3 | 3 / D4 |
| MC3 | MC4 |

(270° READING)
DATA READING SEQUENCE
D3→D1→D4→D2

FIG. 6

(WRITING OPERATION)

| CYCLE | 1 | 2 | 3 | 4 |
|---|---|---|---|---|
| SELECTED WORD LINE | WX1 | WX1 | WX2 | WX2 |
| SELECTED BIT LINE | BY1 | BY2 | BY1 | BY2 |
| SELECTED MEMORY CELL | MC1 | MC2 | MC3 | MC4 |

FIG. 7

(0° READING OPERATION)

| CYCLE | 1 | 2 | 3 | 4 |
|---|---|---|---|---|
| SELECTED WORD LINE | WX1 | WX1 | WX2 | WX2 |
| SELECTED BIT LINE | BY1 | BY2 | BY1 | BY2 |
| SELECTED MEMORY CELL | MC1 | MC2 | MC3 | MC4 |

FIG. 8

(90° READING OPERATION)

| CYCLE | 1 | 2 | 3 | 4 |
|---|---|---|---|---|
| SELECTED WORD LINE | WY2 | WY2 | WY1 | WY1 |
| SELECTED BIT LINE | BX1 | BX2 | BX1 | BX2 |
| SELECTED MEMORY CELL | MC2 | MC4 | MC1 | MC3 |

FIG. 9

(180° READING OPERATION)

| CYCLE | 1 | 2 | 3 | 4 |
|---|---|---|---|---|
| SELECTED WORD LINE | WX2 | WX2 | WX1 | WX1 |
| SELECTED BIT LINE | BY2 | BY1 | BY2 | BY1 |
| SELECTED MEMORY CELL | MC4 | MC3 | MC2 | MC1 |

FIG. 10

(270° READING OPERATION)

| CYCLE | 1 | 2 | 3 | 4 |
|---|---|---|---|---|
| SELECTED WORD LINE | WY1 | WY1 | WY2 | WY2 |
| SELECTED BIT LINE | BX2 | BX1 | BX2 | BX1 |
| SELECTED MEMORY CELL | MC3 | MC1 | MC4 | MC2 |

0° WRITING

RESULT OF 0° READING

READING SEQUENCE
: a-0, b-0, ⋯, h-0
  a-1, b-1, ⋯, h-1
  ⋮    ⋮        ⋮
  a-7, b-7, ⋯, h-7

RESULT OF 90° READING

READING SEQUENCE
: h-0, h-1, ⋯, h-7
  g-0, g-1, ⋯, g-7
  ⋮    ⋮        ⋮
  a-0, a-1, ⋯, a-7

RESULT OF 180° READING

READING SEQUENCE
: a-7, b-7, ⋯, h-7
  a-6, b-6, ⋯, h-6
  ⋮    ⋮        ⋮
  a-0, b-0, ⋯, h-0

RESULT OF 270° READING

READING SEQUENCE
: a-7, a-6, ⋯, a-0
  b-7, b-6, ⋯, b-0
  ⋮    ⋮        ⋮
  h-7, h-6, ⋯, h-0

(a)

0°  A (c)

180°  ∀

(b)

90°  ⊲

(d)

270°  ⊳

STATIC RANDOM ACCESS MEMORY ALLOWING READING ANGLE ROTATION

BACKGROUND OF THE INVENTION

1. Field of the Invention

The present invention relates to static random access memories (hereinafter referred to as static RAMs) and, more specifically, to a static RAM in which reading angle can be arbitrary set to 0°, 90°, 180° and 270°.

2. Description of the Background Art

In image processing by a printer, a word processor, a copying machine or by a high vision television, images to be displayed are often subjected to X-Y conversion (reading angle rotation) with respect to original image data. The reading angle rotation is indispensable when characters written laterally are changed to be written vertically, or when characters are to be printed on a rear surface of a sheet-of paper by a printer, for example. FIGS. 13 (a), (b), (c) and (d) are examples of reading angle rotation by the angle of 0°, 90°, 180° and 270°, respectively, of the character "A".

FIG. 14 shows a concept of an example of a conventional method for X-Y converting an original character by a prescribed angle. For different fonts of the character "A" provided by rotating the character by 0°, 90°, 180° and 270° are stored in four font memories 200, 201, 202 and 203 formed of, for example, read only memories (ROMs), as shown in FIG. 14. A necessary font is selected from four font memories 200, 201, 202 and 203 by a switch 204, and the necessary font is generated at an output terminal 205.

In this method, speed of conversion is fast. However, it requires a memory of large storage capacity for storing a large number of fonts. In addition, this method cannot be applied to ever changing data such as outputs from a video camera.

In another conventional method, only one type of font is prepared for each character, and the font is converted by a desired angle to be outputted by means of software using a controller such as a MPU (Micro Processing Unit), a MCU (Memory Control Unit) or the like. However, in this method, the speed of conversion is very slow.

FIG. 15 is a block diagram showing a structure of a main portion of a conventional static RAM by which displayed images can be moved, inclined or rotated at high speed. This static RAM is disclosed in Japanese Patent Laying-Open No. 63-53783.

An X axis address decoder DDCRX, an X axis column switch CSWX, an X axis shift register SRX, a Y axis address decoder DCRY, a Y axis column switch CSWY and a Y axis shift register SRY are connected to a memory array M-ARY. An input/output circuit I/O is provided for inputting and outputting data.

FIG. 16 shows a detailed structure of the memory array M-ARY. Referring to FIG. 16, memory array M-ARY includes a plurality of X axis word lines WX0 to WXn and a plurality of sets of X axis complementary data lines DX0, DX0 to DXn,/DXn arranged in the vertical direction of the figure, and a plurality of Y axis word lines WY0–WYn and a plurality of sets of Y axis complementary data lines DY0,/DY0 to DYn,/DYn arranged in the horizontal direction of the figure. Memory cells MC00–MCnn are arranged at crossings of the word lines and complementary data lines.

X axis word lines WX0–WXn are coupled to X axis address decoder DCRX, and X axis complementary data lines DX0,/DX0 to DXn,/DXn are connected to corresponding bits of X axis shift register FRX through X axis column switch CSWX. X axis column switch CSWX includes a plurality of sets of switch MOSFETs Q7, QS, ..., Q9 and Q10. x axis complementary data lines DX0,/DX0-DXn, /DXn are coupled to X axis complementary common data lines CDX and/CDX through switch MOSFETs Q7, Q8–Q9 and Q10. Data line selecting signals DX0–DXn from X axis address decoder DCRX are applied to the gates of each sets of switch MOSFETs Q7, Q8–Q9 and Q10.

X axis complementary common data lines CDX and/CDX are connected to input/output circuit I/O. The leading bit and the last bit of X axis shift register SRX are connected to the input/output circuit I/O through serial data signal lines SDX and/SDX.

Any of the plurality of X axis word lines WX0–WXn is selected by X axis address decoder DCRX, or any of the plurality of sets of X axis complementary data lines DX0, DX0 to DXn, /DXn is selected.

Similarly, Y axis word lines WY0–WYn are coupled to Y axis address decoder DCRY, and Y axis complementary data lines DY0,/DY0 to DYn,/DYn are coupled to Y axis shift register SRY through Y axis column switch CSWY.

Any of the plurality of Y axis word lines WY0–WYn is selected by Y axis addressdecoder DCRY, or any of the plurality of sets of Y axis complementary data lines DY0, DY0 to DYn,/DYn is selected.

As described above, each memory cell of memory array M-ARY is coupled to an X axis word line, X axis complementary data lines, a Y axis word line and Y axis complementary data lines. Therefore, it can be accessed from the X axis through the X axis word line and Y axis complementary data lines, and from Y axis through the Y axis word line and X axis complementary data lines.

It is possible to read data stored in a memory cell coupled to the selected word line to a shift register, to shift the data for a prescribed number of times, and to write the shifted data to a memory cell of the memory array. By repeating such shifting operation, displayed image can be moved in horizontal or vertical direction, inclined or rotated at high speed.

In the above described static RAM, each memory cell includes resistances R1 and R2 and MOSFETs Q1 and Q2 constituting a latch circuit. For example, in a memory cell MC00, nodes N1 and N2 are connected to the Y axis complementary data lines DY0 and/DY0 through MOSFETs Q3 and Q4 serving as access gates, and connected to X axis complementary data lines DX0 and/DX0 through MOSFETs Q5 and Q6 serving as access gates.

In this manner, in the memory cell of FIG. 16, complementary data are written to two nodes N1 and N2 through X axis complementary data lines or Y axis complementary data lines, and complementary data are read from two nodes N1 and N2 through X axis complementary data lines or Y axis complementary data lines. Therefore, four access gates and sixth signal lines are necessary. Consequently, the number of elements and the circuit area are increased, and interconnections inevitably become complicated.

In the above described static RAM, write drivers DRa and DRb and a sense amplifier SXa are connected to X axis complementary data lines DX0,/DX0, and at least a sense amplifier SAY is connected to Y axis complementary data lines DY0, /DY0.

Similarly, write drivers and sense amplifiers are connected to other X axis complementary data lines, and similarly sense amplifiers are connected to other Y axis complementary data lines.

Write driver DRa includes P channel MOSFETs Q51, Q52 and N channel MOSFETs Q53, Q54, while write driver DRb includes P channel MOSFETs Q55, Q56 and N channel MOSFETs Q57, Q58. Input data Din is applied to the gates of the transistors Q52 and Q53 of the write driver DRa, and input data Din is applied to the gates of transistors Q56 and Q57 of write driver DRb through an inverter G11. Write drivers DRa and DRb are controlled by a write enable signal WE and its inverted signal /WE. Sense amplifier SAX includes P channel MOSFETs Q59, Q60 and N channel MOSFETs Q61, Q62, while sense amplifier SAY includes P channel MOSFETs Q63, Q64 and N channel MOSFETs Q65, Q66. Sense amplifiers SAX and SAY provides output data DO, respectively.

In this manner, in the above described static RAM, 12 MOSFETs and one inverter are necessary for the write drivers and sense amplifier connected to a set of X axis complementary data lines, and 4 MOSFETs are necessary for the sense amplifier connected to one set of Y axis complementary data lines. Consequently, the number of elements and the circuit area increase in the peripheral circuit, and the interconnection becomes complicated.

SUMMARY OF THE INVENTION

An object of the present invention is to provide a static random access memory in which written data can be read rotated at high speed, and to provide a method of operating the same.

Another object of the present invention is to reduce number of elements and circuit area and to simplify interconnections in a static random access memory allowing high speed reading angle rotation of written data.

A further object of the present invention is to enable high speed reading angle rotation of various data by using a memory of small storage capacity.

A static random access memory in accordance with the present invention includes a plurality of memory cells arranged in a plurality of rows and columns, a plurality of first word lines, a plurality of second word lines, a plurality of first single bit lines, a plurality of second single bit lines, a first word selector, a second word selector, a first bit selector, a second bit selector, a write circuit and a read circuit. The plurality of first word lines are provided corresponding to the plurality of rows, each connected to memory cells of the corresponding row. The plurality of second word lines are provided corresponding to the plurality of columns, each connected to memory cells of the corresponding column. The plurality of first single bit lines are provided corresponding to the plurality of columns, each connected to memory cells of the corresponding column. The plurality of second single bit lines are provided corresponding to the plurality of rows, each connected to memory cells of a corresponding row.

The first word selector selects any of the plurality of first word lines. The second word selector selects any of the plurality of second word lines. The first bit selector selects any of the plurality of first single bit lines. The second bit selector selects any of the plurality of second single bit lines. The write circuit writes data to a bit line which is selected either by the first or second bit selector during writing operation. The read circuit reads data from a bit line selected by either the first or second bit selector during reading operation.

Each memory cell includes first and second nodes to which complementary data are applied, a holding circuit for holding complementary data at the first and second nodes, and first and second single access gates. The first single access gate is connected between the first node and a corresponding first single bit line, and has a control terminal connected to a corresponding first word line. The second single access gate is connected between the second node and a corresponding second single bit line, and has a control terminal connected to a corresponding second word line.

The write circuit may includes at least one writing circuit connected to at least one of the first and second bit selectors. The reading circuit may includes a first read circuit connected to the first bit selector and a second read circuit connected to the second bit selector.

In data writing operation, when one first word line and one first single bit line are selected by the first word selector and the first bit selector, data is written to the first node of the selected memory cell through the selected first single bit line and the first single access gate.

In data writing operation, one second word line and one second single bit line may be selected by the second word selector and the second single bit selector.

In data reading operation, when one first word line and one first single bit line are selected by the first word selector and the first bit selector, data held at the first node of the selected memory cell is read through the first single access gate and through the selected first single bit line.

In data reading operation, when one second word line and one second single bit line are selected by the second word selector and the second bit selector, data held at the second node of the selected memory cell is read through the second single access gate and the selected second single bit line.

In this manner, data writing operation is carried out by using either the first or second node of each memory cell, and data reading operation is carried out by selectively using the first and the second nodes of each memory cell. Therefore, each memory cell includes only two single access gates, and it is connected to only four signal lines.

In each memory cell, data written to one node through one single access gate can be read from either of the two nodes. Therefore, written data can be arbitrarily subjected to reading angle rotation.

Therefore, reading angle rotation of various data can be realized by a memory having small storage capacity.

In addition, since each memory cell includes only two single access gates and it is connected to only four signal lines, the number of elements and circuit area can be reduced, and interconnections can be made simple.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows order of data writing or reading in various operations of the static RAM shown in FIG. 1.

FIG. 6 is a table for writing operation of the static RAM shown in FIG. 1.

FIG. 7 is a table for reading operation at 0° of the static RAM of FIG. 1.

FIG. 8 is a table for reading operation at 90° of the static RAM of FIG. 1.

FIG. 9 is a table for reading operation at the static RAM of FIG. 1.

FIG. 10 is a table for the reading operation at 270° of the static RAM of FIG. 1.

FIG. 11 shows 64 pixel display of a letter "A".

DESCRIPTION OF THE PREFERRED EMBODIMENTS

Figure 1:
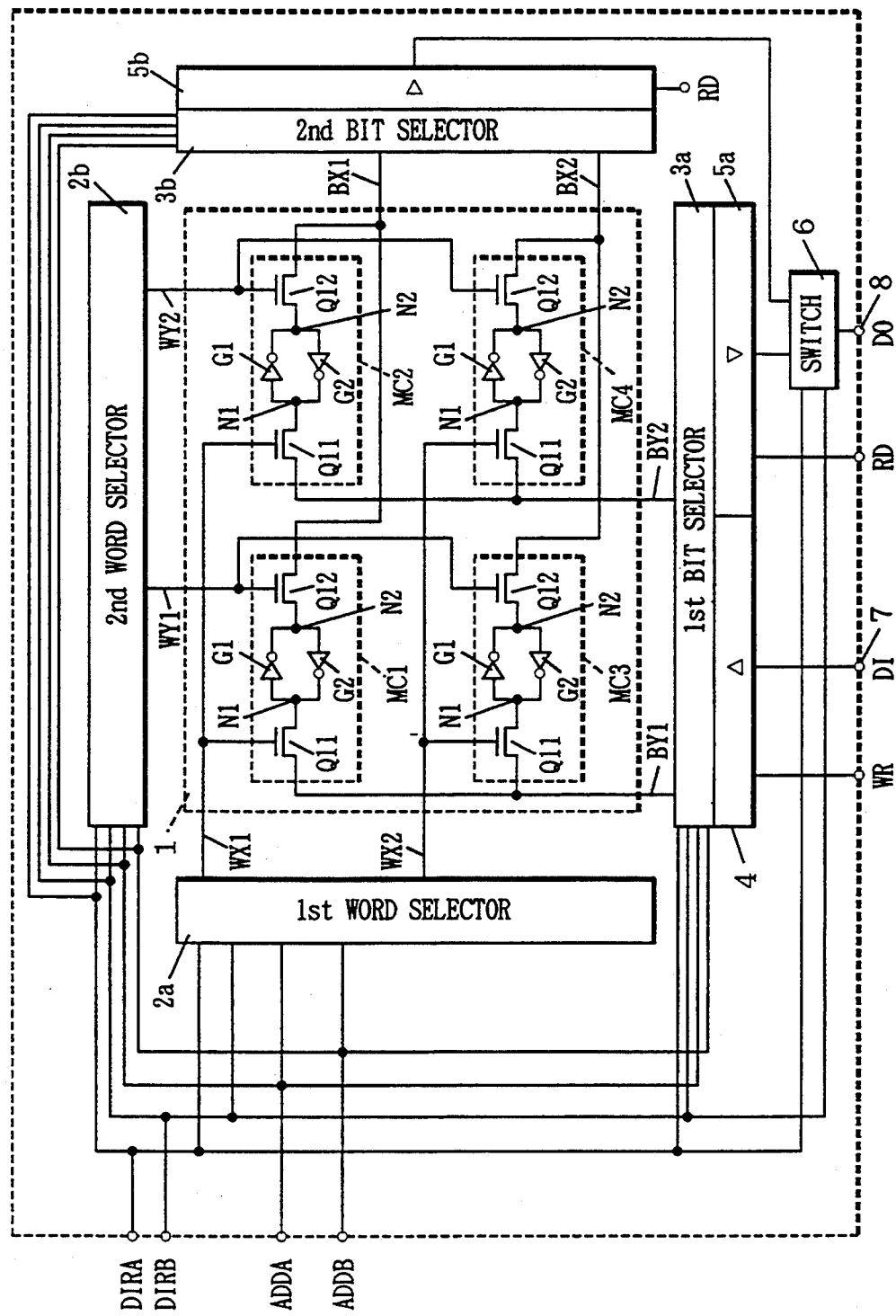
FIG. 1 shows a structure of a static RAM in accordance with one embodiment of the present invention.

FIG. 1 shows a structure of a static RAM in accordance with one embodiment of the present invention. The static RAM includes a memory array 1, a first word selector 2a, a second word selector 2b, a first bit selector 3a, a second bit selector 3b, a write circuit 4, a first read circuit 5a, a second read circuit 5b and a switch 6.

Memory array includes a plurality of memory cells arranged in a plurality of rows and columns. For example, memory array 1 includes 4096 memory cells arranged in 64 rows and 64 columns. For the simplicity of description, four memory cells MC1 to MC4 arranged in two rows and two columns are shown. A plurality of first word lines WX1 and WX2 are connected to first word selector 2a, and a plurality of second word lines WY1 and WY2 are connected to second word selector 2b. A plurality of first bit lines BY1 and BY2 are connected to first bit selector 3a, and a plurality of second bit lines BX1 and BX2 are connected to second bit selector 3b.

Write circuit 4 and first read circuit 5a are connected to first bit selector 3a, and second read circuit 5b is connected to second bit selector 3b. Write circuit 4 includes an input buffer and the like, and first and second read circuits 5a and 5b include sense amplifiers, output buffers and the like.

Write circuit 4 is connected to an input terminal 7 receiving input data DI. Outputs from first and second read circuits 5a and 5b are applied to switch 6. Switch 6 selectively applies outputs from the first or second read circuit 5a or 5b as output data DO to an output terminal 8.

First word line WX1 is connected to memory cells MC1 and MC2, and first word line WX2 is connected to memory cells MC3 and MC4. Second word line WY1 is connected to memory cells MC1 and MC3, and second word line WY2 is connected to memory cells MC2 and MC4. First bit line BY1 is connected to memory cells MC1 and MC3, and first bit line BY2 is connected to memory cells MC2 and MC4. Second bit line BX1 is connected to memory cells MC1 and MC2, and second bit line BX2 is connected to memory cells MC3 and MC4.

Each of the memory cells MC1 to MC4 includes first and second access gates Q11 and Q12 and two inverters G1 and G2. Inverters G1 and G2 are connected in reverse parallel between the first and second nodes N1 and N2. First access gate Q11 is connected between first node N1 and corresponding first bit line, and has its gate terminal connected to the corresponding first word line. Second access gate Q12 is connected between second node N2 and second bit line, and has its gate terminal connected to the corresponding second word line.

Control signals DIRA, DIRB, ADDA, and ADDB are externally applied to each of the first word selector 2a, the second word selector 2b, the first bit selector 3a and the second bit selector 3b. A write pulse WR is externally applied to write circuit 4, and read pulse RD is externally applied to read circuits 5a and 5b. Control signals DIRA and DIRB are applied to the switch 6.

First word selector 2a selects one of first word lines WX1 and WX2, and raises potential of the selected first word line to "H". For example, when first word line WX1 is selected, first access gates Q11 of memory cells MC1 and MC2 are turned on, and first nodes N1 of memory cells MC1 and MC2 are connected to first bit lines BY1 and BY2, respectively. Second word selector 2b selects one of second word lines WY1 and WY2, and raises potential of the selected second word line to "H". When second word line WY1 is selected, for example, second access gates Q12 of memory cells MC1 and MC3 are turned on, and second nodes N2 of memory cells MC1 and MC3 are connected to second bit lines BX1 and BX2, respectively. First bit selector 3a selects one of first bit lines BY1 and BY2, and in data writing, connects the selected first bit line to write circuit 4, and in data reading, connects the same to the read circuit 5a. Second bit selector 3b selects one of second bit lines BX1 and BX2, and connects selected second bit line to second read circuit 5b.

Figure 2:
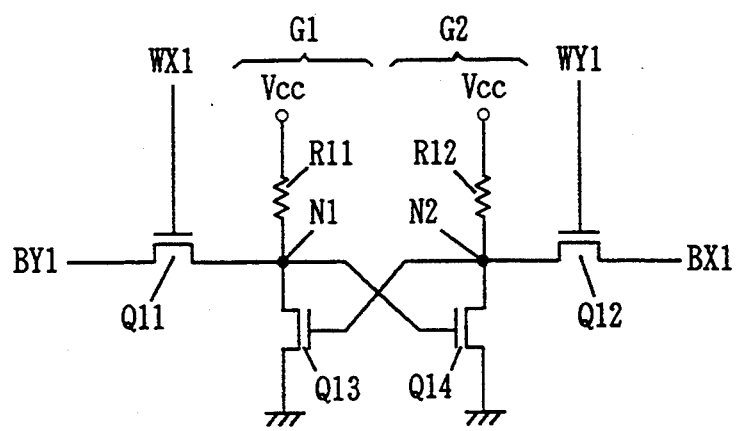
FIG. 2 is a circuit diagram showing detailed structure of a memory cell.

FIG. 2 shows a detailed circuit structure of the memory cell MC1. A resistance R11 is coupled between first node N1 and supply potential Vcc, and a resistance R12 is coupled between second node N2 and supply potential Vcc. An N channel MOSFET Q13 is coupled between first node N1 and the ground potential, the gate terminal of which is connected to second node N2. An N channel MOSFET Q14 is coupled between second node N2 and the ground potential, the gate terminal of which is connected to first node N1. First access gate Q11 is connected between first node N1 and first bit line BY1, and its gate terminal is connected to first word line WX1. Second access gate Q12 is connected between second node N2 and second bit line BX1, and its gate terminal connected to second word line WY1. Resistances R11 and R12 and MOSFETs Q13 and Q14 constitute a latch circuit. First and second access gates Q11 and Q12 are formed by N channel MOSFETs.

The memory cell in accordance with the present embodiment includes only two access gates and connected to only four signal lines. Therefore, the number of elements can be reduced and the circuit area can be reduced.

Figure 3:
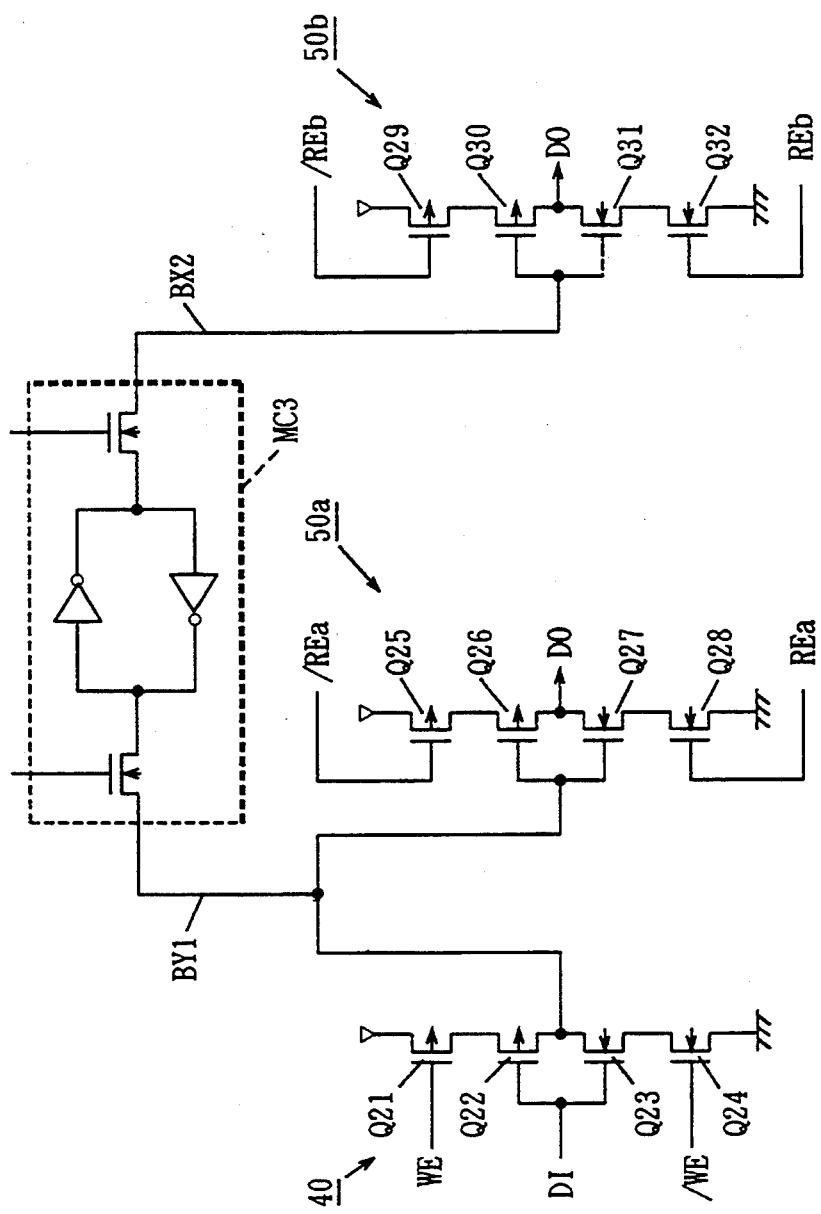
FIG. 3 shows detailed structures of the write driver and the sense amplifier.

FIG. 3 shows detailed circuit structures of a write driver included in write circuit 4 and sense amplifiers included in read circuits 5a and 5b. FIG. 3 shows a write driver 40 and a sense amplifier 50 connected to the first bit line BY1 as well as a sense amplifier 50b connected to the second bit line BX2.

Write driver 40 includes P channel MOSFETs Q21, Q22 and N channel MOSFETs Q23, Q24. Input data DI is applied to the gates of transistors Q22 and Q23. Write driver 40 is controlled by the enable signal WE and the inverted signal/WE which are responsive to the write pulse WR. Sense amplifier 50a includes P channel MOSFETs Q25, Q26 and N channel MOSFETs Q27, Q28. Sense amplifier 50b includes P channel MOSFETs Q29, Q30 and N channel MOSFETs Q31, Q32. Sense amplifiers 50a and 50b provide output data DO.

Sense amplifier 50a is controlled by a read enable signal RDa and its inverted signal/REa, while sense amplifier 50b is controlled by a read enable signal RDb and its inverted signal/REb. Read enable signals REa and REb are obtained by logical operation of control signals DIRA. DIRB, ADDA and ADDB.

Similarly, write drivers and sense amplifiers connected to other first bit lines BY2, and similarly sense amplifiers are connected to other second bit lines BX2.

When the sense amplifiers have the above described structures, the switch 6 shown in FIG. 1 is not necessary. In that case, output from read circuits 5a and 5b are directly supplied to the output terminal 8.

Figure 17:
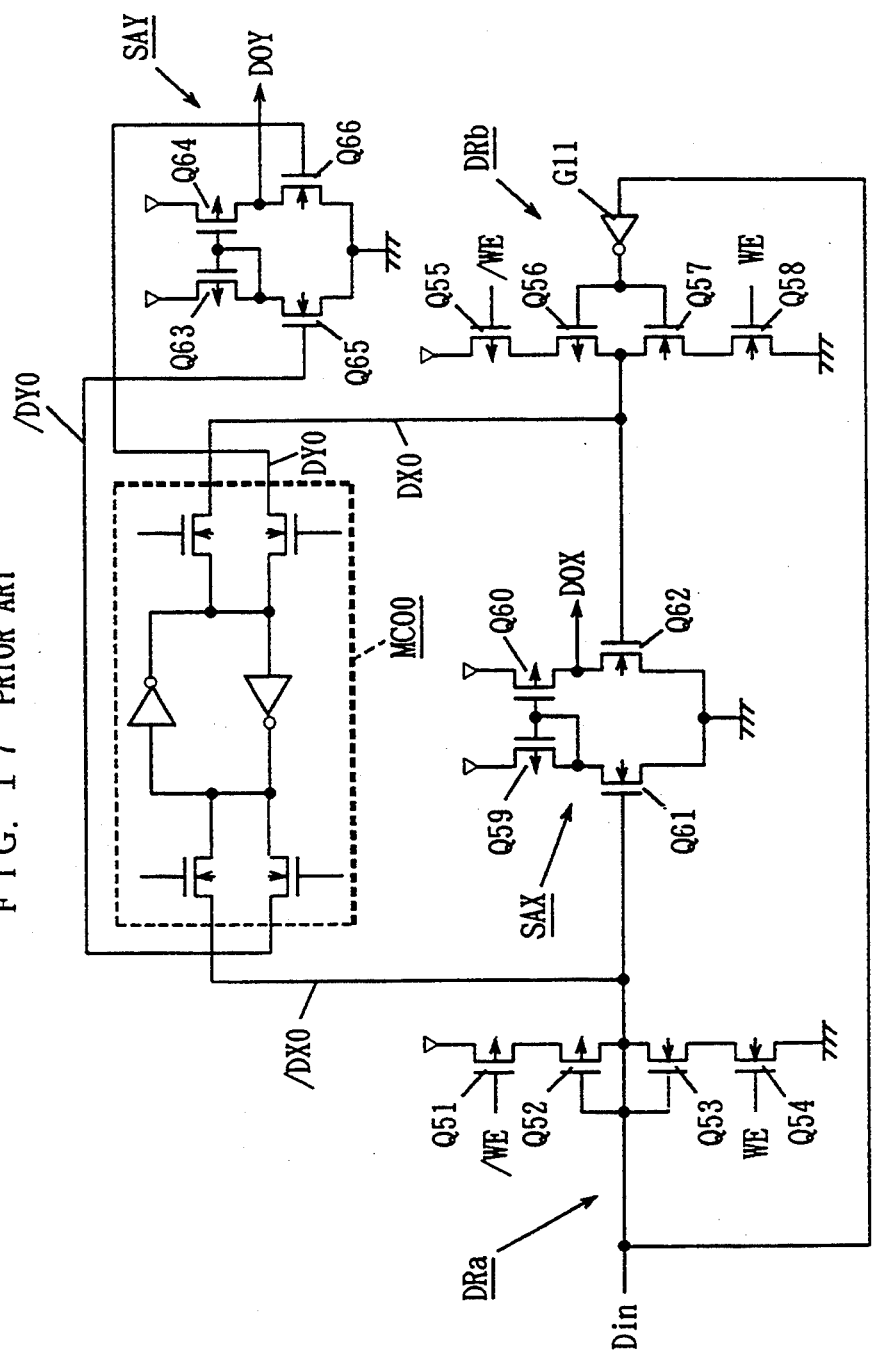
FIG. 17 shows an example of structures of write drivers and sense amplifiers used in the static RAM of FIG. 15.

In this manner, 8 MOSFETs are necessary for the write drivers and the sense amplifier connected to one first bit line, while 4 MOSFETs are necessary for the sense amplifier connected to one second bit line. Therefore, compared with the circuit shown in FIG. 17, the number of elements is reduced and the circuit area is made smaller in the peripheral circuit.

The operation of the static RAM of FIG. 1 will be described with reference to FIGS. 4 to 10.

In the static RAM, 0° writing operation, 0° reading operation, 90° reading operation and, 180° reading operation and 270° reading operation are carried out.

First, referring to FIG. 4, these operations will be briefly described. In FIG. 4, reference characters D1, D2, D3 and D4 represent data to be written to or read from memory cells MC1, MC2, MC3, and MC4, respectively. The numeral in each memory cell denotes the order of writing or the order of reading of data.

In the 0° writing operation (hereinafter simply referred as write operation), data is written in the order of D1, D2, D3 and D4. In the 0° reading operation, data is read in the order of D1, D2, D3 and D4. In the 90° reading operation, data is read in the order of D2, D4, D1 and D3. In 180° reading operation, data is read in the order of D4, D3, D2 and D1. In the 270° reading operation, data is read in the order of D3, D1, D4 and D2.

Figure 5:
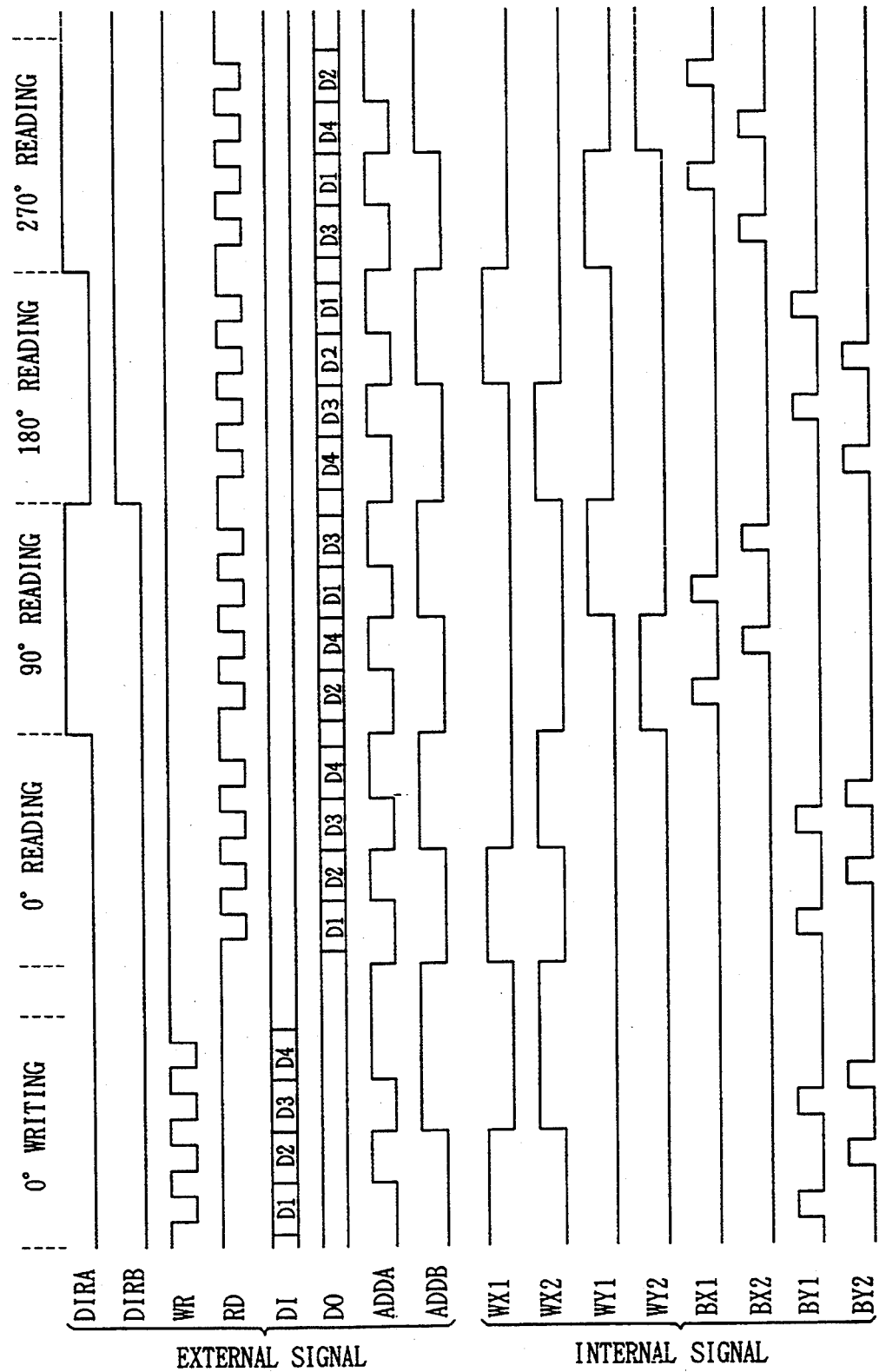
FIG. 5 is a diagram of signal waveforms showing states of external and internal signals in various operations of the static RAM shown in FIG. 1.

FIG. 5 is a diagram of signal waveforms showing the states of external and internal signals at respective operations.

These operations are defined by the control signals DIRA and DIRB. The states of the first and second word lines WX1, WX2, WY1 and WY2 and the first and second bit lines BY1, BY2, BX1 and BX2 are determined by control signals DIRA, DIRB, ADDA and ADDB which are decoded. When write pulse WR is at the low level, data is written. When the read pulse RD is at the low level, data is read.

The waveforms of WX1, WX2, WY1 and WY2 show potentials of respective word lines. The waveforms of BX1, BX2, BY1 and BY2 do not show the signal levels of the respective bit lines but they show, by the high level, the period in which the bit lines are accessed.

FIG. 6 is a table for facilitating understanding of the writing operation. An operation when a character "A" is divided into 4 bits and respective bits are written to memory cells MC1 to MC4 will be described as an example.

In cycle 1, first word line WX1 is selected by first word selector 2a, and first bit line BY1 is selected by first bit selector 3a. Consequently, memory cell MC1 is selected. In response to a write pulse WR, input data DI applied to input terminal 7 is applied to first bit line BY1 through write circuit 4 and first bit selector 3a, and the data is written to nodes N1 and N2 through first access gate Q11 in memory cell MC1.

In cycle 2, first word line WX1 and first bit line BY2 are selected, and the memory cell MC2 is selected. Consequently, input data DI applied to first bit line BY2 is written to memory cell MC2.

In cycle 3, first word line WX2 and first bit line BY1 are selected, and thus memory cell MC3 is selected. Consequently, input data DI applied to first bit line BY1 is written to memory cell MC3.

In cycle 4, first word line WX2 and first bit line BY2 are selected, and thus memory cell MC4 is selected. Consequently, input data DI applied to first bit line BY2 is written to memory cell MC4.

Figures 13, 14:
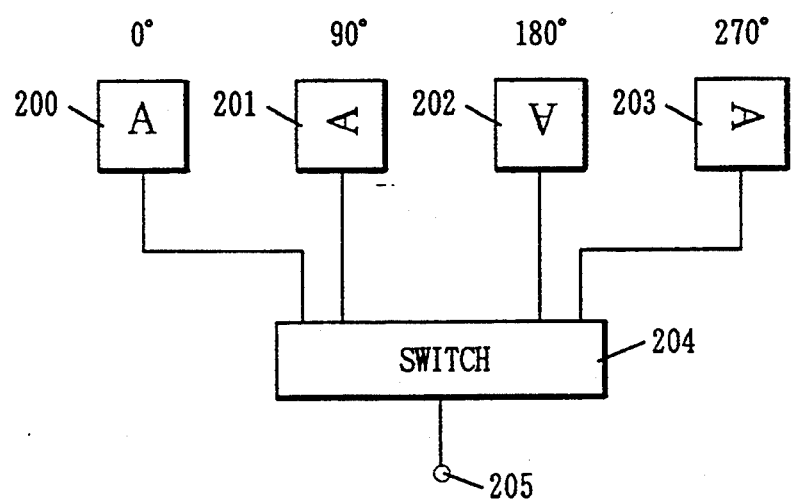
FIG. 13 shows examples of reading angle rotation of the character "A".
FIG. 14 shows a conventional method of reading angle rotation using four different fonts.
Figure 15:
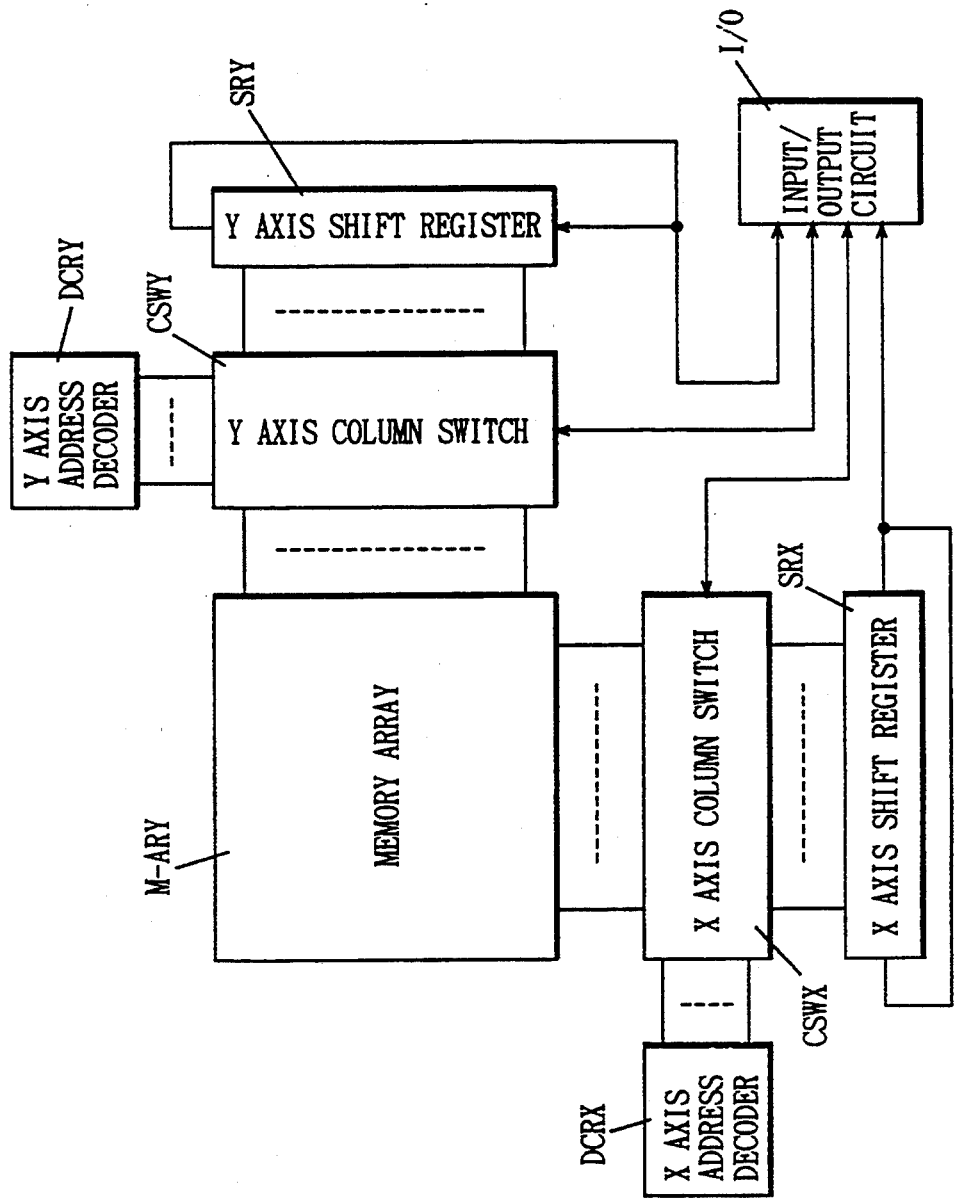
FIG. 15 is a block diagram showing a structure of a main portion of a conventional static RAM in which written data can be read rotated by a predetermined angle.
Figure 16:
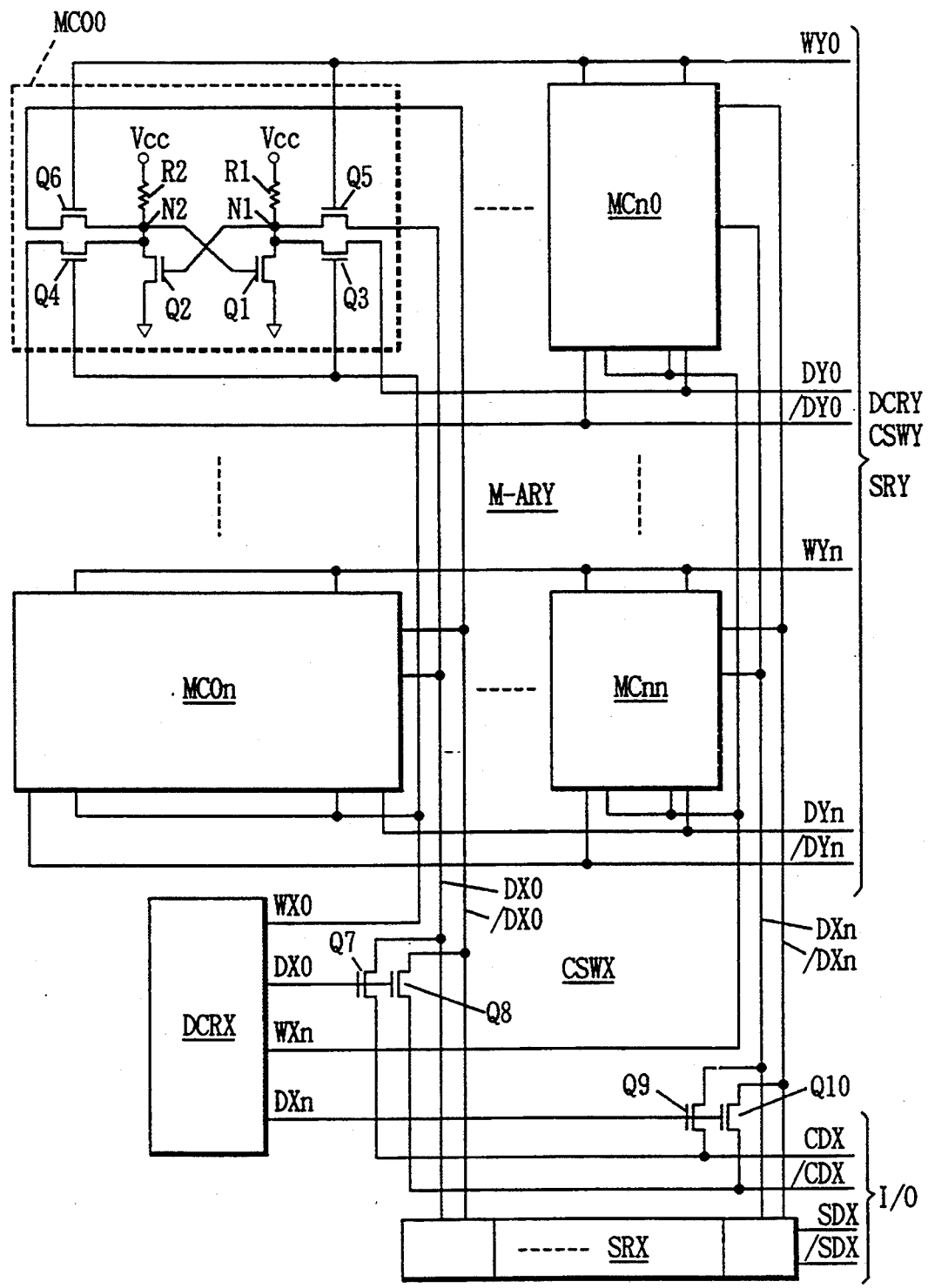
FIG. 16 shows detailed structure of the static RAM of FIG. 15.

FIG. 7 is a table for facilitating understanding of the reading operation at 0°. In the reading operation at 0° the character "A" stored in the memory array 1 is read in such a state as shown in FIG. 13(a).

In cycle 1, first word line WX1 is selected by first word selector 2a, and first bit line BY1 is selected by first bit selector 3a. Consequently, memory cell MC1 is selected. Accordingly, data held at the first node N1 in memory cell MC1 is applied to first bit line BY1 through first access gate Q11, and applied to first read circuit 5a through first bit selector 3a. The data is read as output data DO at output terminal 8 through switch 6, in response to a read pulse RD.

In cycle 2, first word line WX1 and first bit line BY2 are selected, and hence memory cell MC2 is selected. Consequently, data stored in memory cell MC2 is read through first bit line BY2.

In cycle 3, first word line WY2 and first bit line BY1 are selected, and thus memory cell MC3 is selected. Consequently, data stored in memory cell MC3 is read through first bit line BY1.

In cycle 4, first word line WX2 and first bit line BY2 are selected, and thus memory cell MC4 is selected. Consequently, data stored in memory cell MC4 is read through the first bit line BY2.

FIG. 8 is a table for the reading operation at 90°. In the reading operation at 90° the character "A" stored in the memory array 1 is read in such a state as shown in FIG. 13(b).

In cycle 1, second word line WY2 is selected by second word selector 2b, and second bit line BX1 is selected by second bit selector 3b. Consequently, memory cell MC2 is selected. Therefore, data held at second node N2 of memory cell MC2 is applied to second bit line BX1 through second access gate Q12, and further applied to second read circuit 5b through second bit selector 3b. The data is read as output data DO at output terminal 8 through switch 6 in response to read pulse RD.

In cycle 2, second word line WY2 and second bit line BX2 are selected, and thus memory cell MC4 is selected. Consequently, data stored in memory cell MC4 is read through second bit line BX2.

In cycle 3, second word line WY1 and second bit line BX1 are selected, and thus memory cell MC1 is selected. Consequently, data stored in memory cell MC1 is read through second bit line BX1.

In cycle 4, second word line WY1 and second bit line BX2 are selected, and hence memory cell MC3 is selected. Consequently, data stored in memory cell MC3 is read through second bit line BX2.

FIG. 9 is a table for reading operation at 180°. In reading operation at 180°, the character "A" stored in memory array 1 is read in such a state as shown in FIG. 13(c).

First word line WX2 is selected by first word selector 2a, and first bit line BY2 is selected by first bit selector 3a. Consequently, memory cell MC4 is selected. Therefore, data held at first node N1 in memory cell MC4 is applied to first bit line BY2 through first access gate Q11, and further applied to first read circuit a through first bit selector 3a. The data is read as output data DO at output terminal 8 through switch 6 in response to read pulse RD.

In cycle 2, first word line WX2 and first bit line BY1 are selected, and hence memory cell MC3 is selected. Consequently, data stored in memory cell MC3 is read through first bit line BY1.

In cycle 3, first word line WX1 and first bit line BY2 are selected, and thus memory cell MC2 is selected. Consequently, data stored in memory cell MC2 is read through first bit line BY2.

In cycle 4, first word line WX1 and first bit line BY1 are selected, and thus memory cell MC1 is selected. Consequently, data stored in memory cell MC1 is read through first bit line BY1.

FIG. 10 is a table for reading operation at 270°. In reading operation at 270° the character "A" stored in memory array 1 is read in such a state as shown in FIG. 13(d).

In cycle 1, second word line WY1 is selected by second word selector 2b, and second bit line BY2 is selected by second bit selector 3b. Consequently, memory cell MC3 is selected. Therefore, data held at second node N2 in memory cell MC3 is applied to second bit line BX2 through second access gate Q12, and further applied to second read circuit 5b through second bit selector 3b. The data is read as output data DO at output terminal 8 through switch 6 in response to read pulse RD.

In cycle 2, second word line WY1 and second bit line BX1 are selected, and thus memory cell MC1 is selected. Consequently, data stored in memory cell MC1 is read through second bit line BX1.

In cycle 3, second word line WY2 and second bit line BX2 are selected, and thus memory cell MC4 is selected. Consequently, data stored in memory cell MC4 is read through second bit line BX2.

In cycle 4, second word line WY2 and second bit line BX1 are selected, and hence memory cell MC2 is selected. Consequently, data stored in memory cell MC2 is read through second bit line BX1.

As described above, data written in memory array 1 can be read at high speed, rotated by 0°, 90°, 180° or 270°.

Each of first and second word selectors 2a and 2b and first and second bit selectors 3a and 3b includes a counter circuit having an up/down switching terminal and a decoder, and the above described control may be effected by applying a signal from a microprocessor to the up/down switching terminal.

Alternatively, a signal may be applied from the microprocessor to the decoder, without using the counter circuit.

The static RAM shown in FIG. 1 may be formed solely on one chip, or it may be formed with a microprocessor and other peripheral circuitry on one chip.

Although write circuit 4 is connected to first bit selector 3a in the above described embodiment, write circuit 4 may be connected to second bit selector 3b. The read circuit may be respectively connected to first and second bit selectors 3a and 3b.

Figure 12:
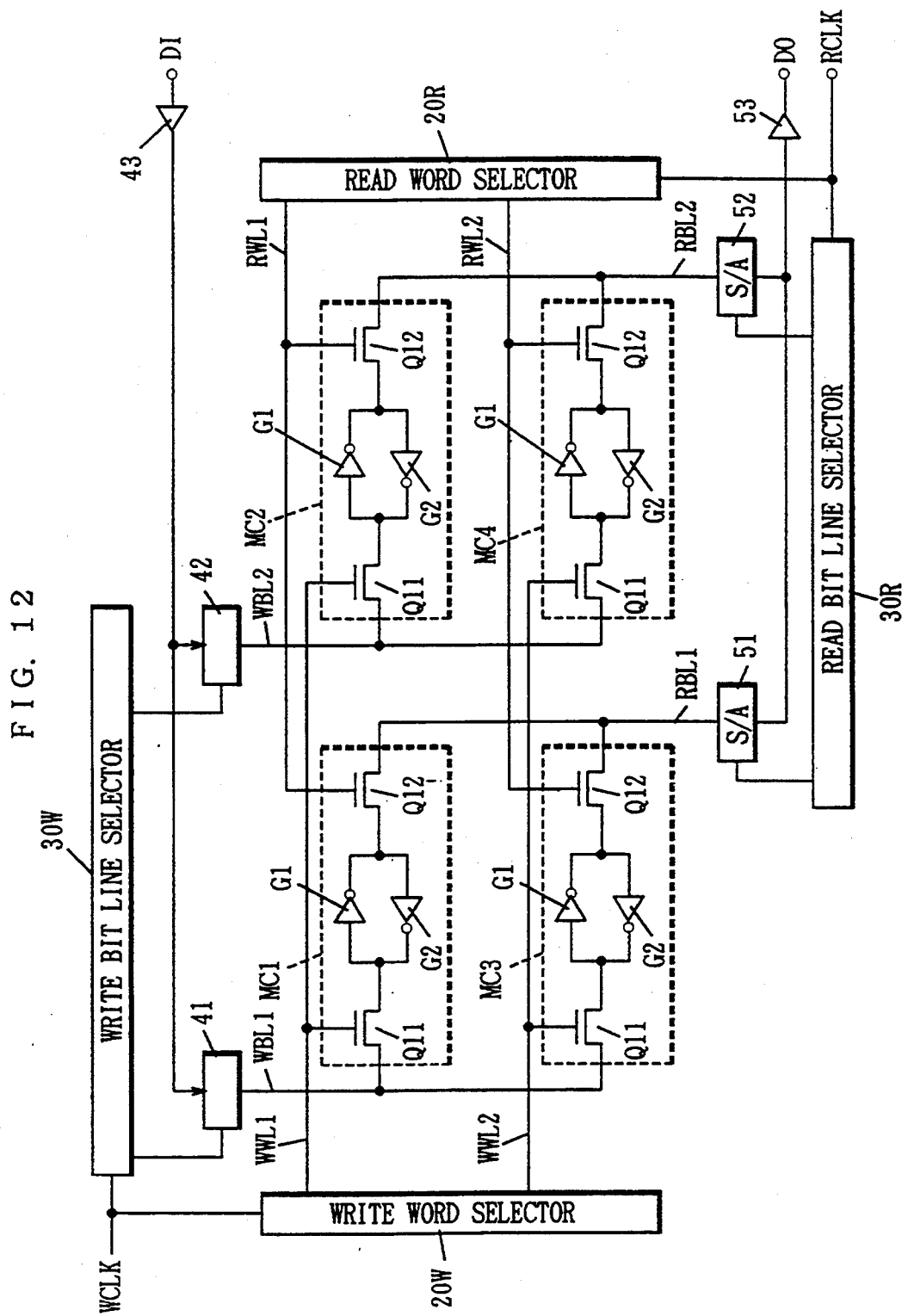
FIG. 12 shows an example in which the memory array shown in FIG. 1 is applied to an FIFO memory.

The memory array shown in FIG. 1 includes four memory cells MC1 to MC4 which are arranged in two rows and two columns, and therefore 4 pixel (picture element) display is carried out. When the memory array 1 includes 64 memory cells arranged in 8 rows and 8 columns, 64 pixel display such as shown in FIG. 11 is carried out. The numerals 0 to 7 denote the row of the memory cells, while the alphabets a to h denote the column of the memory cells. One memory cell is designated by one of the numerals 0 to 7 and one of the alphabets a to h. FIG. 11 shows the result of reading the letter "A" by rotating the same by 0°, 90°, 180° and 270° respectively FIG. 12 shows an example in which the memory array 1 shown in FIG. 1 is applied to a FIFO (First In-First out) memory.

A write word line WWL1 is connected to the gate terminal of the first access gate Q11 of memory cells MC1 and MC2, while a write word line WWL2 is connected to the gate terminal of the first access gate Q11 of the memory cells MC3 and MC4. The read word line RWL1 is connected to the gate terminal of the second access gate Q12 of memory cells MC1 and MC2, while read word line RWL2 is connected to the gate terminal of the second access gate Q12 of memory cells MC3 and MC4. Write word lines WWL1 and WWL2 are connected to the write word selector 20W while read word lines RWL1 and RWL2 are connected to the read word selector 20R.

Write bit line WBL1 is connected to the first access gate Q11 of memory cells MC1 and MC3, while write bit line WBL2 is connected to the first access gate Q11 of memory cells MC2 and MC4. Read bit line RBL1 is connected to the second access gate Q12 of memory cells MC1 and MC3 while read bit line RBL2 is connected to the second access gate Q12 of memory cells MC2 and MC4. Write bit lines WBL1 and WBL2 are connected to the write bit line selector 30W through write bit line on/off switches 51 and 52, respectively, while read bit lines RBL1 and RBL2 are connected to the read bit line selector 30R through sense amplifiers 51 and 52, respectively.

The write bit line selector 30W successively select switches 41 and 42 and turn the switches on in response to a write clock signal WCLK. Switches 41 and 42 receive input data D1 through the input buffer 43. Read bit line selector 30R successively selects and activates sense amplifiers 51 and 52 in response to the read clock signal RCLK. Data amplified by the sense amplifiers 51 and 52 are supplied as output data DO through the output buffer 53.

In the FIFO memory shown in FIG. 12, writing of data is carried out through the first access gate Q11 of each of the memory cells, and data is read through the second access gate Q12 of each of the memory cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static random access memory, comprising:

plurality of memory cells arranged in a plurality of rows and columns;

a plurality of first word lines provided corresponding to said plurality of rows, each connected to memory cells of the corresponding row;

plurality of second word lines provided corresponding to said plurality of columns, each connected to memory cells of the corresponding column;

a plurality of first single bit lines provided corresponding to said plurality columns, each connected to memory cells of the corresponding column;

a plurality of second single bit lines provided corresponding to said plurality of columns, each connected to memory cells of the corresponding row;

first word selecting means for selecting any of said plurality of first word lines;

second word selecting means for selecting any of said plurality of second word lines;

first bit selecting means for selecting any of said plurality of first single lines;

second bit selecting means for selecting any of said plurality of second bit lines;

writing means for writing data to a single bit line selected by said first bit selecting means in writing operation; and reading means for reading data of a single bit line selected by said first or second bit selecting means; wherein each of said plurality of memory cells includes first and second nodes to which complementary data are applied, holding means for holding complementary data of said first and second node, first single access gate means connected between said first node and the corresponding first single bit line and having a control terminal connected to the corresponding first word line, and second single access gate means connected between said second node and the corresponding second single bit line and having a control terminal connected to the corresponding second word line, wherein said writing means includes at least one writing means connected to at least one of said first and second bit selecting means, and said reading means includes first reading means connected to said first bit selecting means and second reading means connected to said second bit selecting means, said memory further comprising:

a data output terminal and switching means for selectively connecting one of said first and second reading means to said data output terminal.

2. A memory according to claim 1, wherein said first single access gate means includes a first field effect element, and said second single access gate means includes a second field effect element.

3. A memory according to claim 2, wherein said first field effect element includes a first N channel type MOS transistor, and said second field effect element includes a second N channel type MOS transistor.

4. A memory according to claim 1, wherein said holding means includes first and second inverter means connected in reverse parallel between said first and second nodes.

* * * * *